United States Patent
Fiedler et al.

(10) Patent No.: US 7,267,786 B2
(45) Date of Patent: Sep. 11, 2007

(54) PHOSPHOR AND LIGHT SOURCE COMPRISING SUCH A PHOSPHOR

(75) Inventors: Tim Fiedler, Munich (DE); Torsten Fries, Stadtbergen (DE); Frank Jermann, Munich (DE); Martin Zachau, Geltendorf (DE); Franz Zwaschka, Ismaning (DE)

(73) Assignee: Patent-Treuhand-Gesellschaft fuer Elektrische Gluehlampen mbH, Munich (DE)

( * ) Notice: Subject to any disclaimer, the term of this patent is extended or adjusted under 35 U.S.C. 154(b) by 279 days.

(21) Appl. No.: 10/523,701

(22) PCT Filed: Dec. 16, 2004

(86) PCT No.: PCT/DE2004/002756

§ 371 (c)(1),
(2), (4) Date: Feb. 3, 2005

(87) PCT Pub. No.: WO2005/061659

PCT Pub. Date: Jul. 7, 2005

(65) Prior Publication Data

US 2005/0242329 A1     Nov. 3, 2005

(30) Foreign Application Priority Data

Dec. 22, 2003 (DE) ............... 103 60 546

(51) Int. Cl.
C09K 11/78 (2006.01)
C09K 11/79 (2006.01)
C09K 11/80 (2006.01)

(52) U.S. Cl. .............. 252/301.4 F; 252/301.4 R; 257/98; 313/486; 313/503

(58) Field of Classification Search ......... 252/301.4 F, 252/301.4 R; 257/98; 313/486, 503
See application file for complete search history.

(56) References Cited

U.S. PATENT DOCUMENTS

| | | | |
|---|---|---|---|
| 4,093,890 A * | 6/1978 | Verriet et al. ............... 313/486 |
| 4,314,910 A | 2/1982 | Barnes | |
| 4,550,256 A | 10/1985 | Berkstresser et al. | |
| 4,716,335 A | 12/1987 | Schutten et al. | |
| 4,783,596 A | 11/1988 | Riedner et al. | |
| 4,810,938 A | 3/1989 | Johnson et al. | |
| 5,196,763 A | 3/1993 | Yang et al. | |
| 5,376,303 A | 12/1994 | Royce et al. | |
| 5,424,006 A | 6/1995 | Murayama et al. | |

(Continued)

FOREIGN PATENT DOCUMENTS

| | | |
|---|---|---|
| DE | 201 08 013 U1 | 9/2001 |
| JP | 53-128587 | * 11/1978 |
| JP | 53-128588 | * 11/1979 |
| JP | 2004067837 | 3/2004 |
| WO | WO 01/93342 | 12/2001 |

OTHER PUBLICATIONS

By J.W.H. van Krevel, "On new rare-earth doped M-Si-Al-O-N materials, Luminescence properties and oxidation resistance", Technische Universiteit Eindhoven, 2000, ISBN 90-386-2711-4, pp. 1-5, 18-27.

(Continued)

Primary Examiner—C. Melissa Koslow
(74) Attorney, Agent, or Firm—Robert F. Clark

(57) ABSTRACT

A phosphor with a garnet structure is distinguished by the addition of Si. It is suitable in particular for photon excitation by light sources with an emission between 250 and 550 nm.

24 Claims, 18 Drawing Sheets

U.S. PATENT DOCUMENTS

| | | |
|---|---|---|
| 5,998,925 A | 12/1999 | Shimizu et al. |
| 6,632,379 B2 | 10/2003 | Mitomo et al. |
| 6,700,322 B1 | 3/2004 | Duggal et al. |
| 7,029,602 B2 * | 4/2006 | Oshio ................ 252/301.4 R |
| 2002/0137709 A1 | 9/2002 | Lin et al. |
| 2002/0195587 A1 | 12/2002 | Srivastava et al. |
| 2003/0001495 A1 | 1/2003 | Liu et al. |
| 2003/0006469 A1 | 1/2003 | Ellens et al. |
| 2004/0062699 A1 | 4/2004 | Oshio |
| 2005/0093431 A1 * | 5/2005 | Hancu et al. ............... 313/503 |
| 2006/0197443 A1 * | 9/2006 | Setlur et al. ............... 313/512 |

OTHER PUBLICATIONS

J. Shmulovich et al., "Single-Crystal Rare-Earth-Doped Yttrum Orthosilicate Phosphors", Journal of the Electrochemical Society, Dec. 1988, No. 12, pp. 3141-3151.

* cited by examiner

PHOSPHOR AND LIGHT SOURCE COMPRISING SUCH A PHOSPHOR

TECHNICAL FIELD

The invention is based on a phosphor and light source having such a phosphor. It relates in particular to a garnet-based phosphor which is suitable for use in light sources such as LEDs and lamps.

PRIOR ART

DE-U 201 08 013 has already disclosed a phosphor and light source comprising such a phosphor, in which a phosphor is a garnet of defined rare earths. The use of various rare earths provides the option of setting the color locus of the phosphor within certain limits. However, phosphors of this type, if Y is not the main component of the lattice site occupied by rare earths, are relatively unstable or rather inefficient or have only a low absorption capacity. Although Al may be partially replaced by Ga in the garnet, in particular with these known phosphors with a color locus in the green spectral region, the excitability and consequently also the efficiency of the conversion are not satisfactory. A further restriction on the desired color locus of a known garnet phosphor aimed at realizing a white LED is that a relatively high cerium concentration tends to be required for this purpose, but this can only be realized with very considerable difficulty in terms of manufacturing technology.

Hitherto, a combination of a plurality of phosphors has had to be used to realize defined color loci corresponding, for example, to a neutral white or warm white luminous color. This two-component system in principle has a number of drawbacks: the longer-wave phosphor generally absorbs the emission of the shorter-wave phosphor. Furthermore, the particle sizes of the phosphors have to be matched to one another so that no agglomeration or sedimentation occurs. An additional factor is that the phosphors have to be very homogeneously mixed in an exact mixing ratio in order to avoid color locus fluctuations. Finally, the known phosphors generally have different temperature dependencies, which can result in a color locus drift in the event of the LED being dimmed or at different ambient temperatures.

SUMMARY OF THE INVENTION

It is an object of the present invention to provide a phosphor which is distinguished by being robust and highly sensitive in terms of the selection of color locus within a wide range of the chromaticity diagram.

A further object is to produce a highly efficient, stable green phosphor with a garnet structure for use in LEDs with full-color capability based on a primary LED which emits at a short wavelength, for example in the blue, with a long service life.

A further object is to produce a highly efficient garnet phosphor with an accurately matched color locus for photon excitation, in particular by white LEDs, and also to provide a light source, in particular a white LED with a neutral to warm white luminous color and with just one phosphor as converter. If a single phosphor is used, it is possible to restrict fluctuations in color locus and to simplify production, since there are no mixing and sedimentation problems. Of course, the phosphor can also be used together with other phosphors to provide a light source.

This object is achieved by a phosphor with a garnet structure of type $A_3B_5O_{12}:D$, characterized in that part of component B is replaced by Si in a proportion x, it being possible for at least one further component (KA, KB, KC) to be incorporated for charge compensation where A=rare earth and B=Al, Ga alone or in combination, and D=rare earth. In one embodiment x=0.1 to 0.5. The substitution of component B, in particular $Al^{3+}$, by $Si^{4+}$ in accordance with the invention leads to a pronounced color locus shift in phosphor systems with a garnet structure, for example Y(Al, Ga)G:Ce. In this context, a further component is normally always required for reasons of charge compensation, since Si is a tetravalent ion, but component B, such as for example Al, is a trivalent ion. For this reason, hitherto only the obvious route of replacing Al with other trivalent ions, such as Ga or In, which occupy the same lattice site, has ever been investigated.

There are a number of ways of realizing this. In a first embodiment, an ion KB which occupies the same lattice site but has a valence of less than 3, i.e. a monovalent or divalent ion, such as for example $Mg^{2+}$, is introduced simultaneously with Si. Another possible option is $Be^{2+}$, for example. In these cases, the replacement ion KB is often introduced as an oxide, so that no further charge compensation is required on account of the garnet structure.

In a second embodiment, a different route is taken, in that an ion KC which occupies a different lattice site of opposite charge polarity is introduced simultaneously with Si. On account of the different charge polarity, in this case, there is no restriction on the choice of valence. In this case, it is particularly preferable for oxygen (to be understood as meaning $O^{2-}$) to be replaced by nitrogen (to be understood as meaning $N^{3-}$).

In a third embodiment, an ion KA which occupies a different lattice site, namely that of component A, is introduced simultaneously with Si. In this case, the charge polarity is once again the same as that of Si. Examples of suitable candidates include Na and Li.

In a fourth embodiment, no further ion is introduced with Si, but rather the charge compensation is effected by means of vacancies (designated in accordance with Kröger-Vink as $V_A$ or $V_B$ or $V_C$ if the vacancy is at the lattice site of A, B or O), which are considered to have their own valence of zero.

In general terms, ions whose radius is as close as possible to the radius of the ion to be replaced are preferably suitable. In practice, it has been found that if the radius is larger the limit for this is 30%, i.e. a radius which is 1.3 times greater. In the case of an ion whose radius is smaller than that of the ion to be replaced, this limit is much less critical.

The substitution while maintaining the garnet structure has nothing to do with the new types of nitridosilicates, which, although they may be composed of similar individual components, have a completely different stoichiometry, lattice structure and emission performance; a typical lattice structure is α-sialon, cf. "On new rare-earth doped M—Si—Al—O—N materials", van Krevel, T U Eindhoven 2000, ISBN 90-386-2711-4, Chapter 2.

In detail, in the case of simultaneous charge compensation by exchanging $O^{2-}$ for $N^{3-}$, a significantly shorter-wave emission is found than for a corresponding garnet with conventional partial replacement of the Al with Ga, i.e. Y(Al, Ga)G:Ce, as has hitherto been known from the literature. The high quantum efficiency of the pure YAG:Ce phosphor is in this case virtually retained. By way of example, it is possible to synthesize phosphors containing 4 mol % of cerium as activator and with a dominant wavelength of between 559 nm and 573 nm with a quantum efficiency of approx. 85-90%. Without the use of silicon, the cerium doping would have to be very greatly reduced to achieve comparable dominant wavelengths. With a 4% cerium doping, in practice 563 nm was the shortest dominant wavelength achieved. The cerium doping is in the range from 0.1 to 10%.

Surprisingly, the substitution acts differently in pure Al—containing garnet phosphors of the (Y, Tb, Gd)AG:Ce type. Slight substitution (<1 mol %) of Al by Si in YAG:Ce makes it possible to shift the dominant wavelength a few nanometers toward longer wavelengths without the efficiency of the phosphor decreasing. As a result, it is possible to "optimally" set the white color locus of the standard white LED without having to use a second, generally less efficient phosphor for color locus correction.

If the silicon content is increased to up to 20 mol %, in particular in the range from 1-20 mol %, preferably up to 10 mol %, an ever more clearly visible red cerium emission is obtained. As a result, the dominant wavelength is shifted to up to 584 nm. It is found that when using a phosphor of this type, by way of example, it is possible to produce a warm white LED with a color temperature of approx. 3200 K and an Ra value around 75-80 with just one phosphor. The quantum efficiency of the phosphor rises with a decreasing Si content. Therefore, the corresponding LED efficiency rises with an increasing color temperature. It is possible to realize light sources which are in the range of luminous colors from similar to daylight through neutral white to warm white, in particular in the color temperature range from 2600 to 6500 K.

In this context, of course, the term garnet structure is also intended to encompass a structure which deviates slightly from an ideal garnet and is based on vacancies or lattice disturbances, provided that this crystal retains the typical garnet structure.

A typical phosphor according to the invention has the ideal garnet structure $A_3B_5O_{12}$:D with the novel basic modification in which Si is positioned only on the lattice site of component B, and charge neutrality needs to be maintained, for example realized as $A_3B_{5-x}Si_x(KA,KB,KC)_y O_{12-y}$: D, with A=rare earth (RE) selected from the group consisting of Y, Gd, Tb, La, Lu, individually or in combination;

B=Al, Ga, individually or in combination;

D=activator which replaces RE, selected from the group consisting of Ce, Pr, Eu, individually or in combination;

(KA, KB, KC)=charge compensator, selected in particular from $Mg^{2+}$, $Be^{2+}$ and $N^{3-}$, which compensates for the charge mismatch of the Si.

In this context, in particular the following relationships apply: $0<x\leq 1$ and $0\leq y\leq 2x$.

The value of y depends on the specific details of the crystal structure, in particular if the charge compensator is N, y=x.

In general, it should specifically be taken into account that different lattice sites may have different valencies, and consequently a formation of the modified garnet taking account of possible compensating components KA on lattice site A, compensating components KB on lattice site B and compensating components KC on the lattice site of the oxygen leads to the general formula $[A_{3-a}KA_a]_A[B_{5-b-x}KB_bSi_x]_B[O_{12-s}KC_s]o$:D in which the activator D is to be counted as part of component A. In other words, therefore, the formula can also be expressed as $[A_{3-t-a\#}KA_{a\#}D_t]_A [B_{5-b-x}\ KB_bSi_x]_B[O_{12-s}KC_s]_O$. In this formula, a# is a different value than a, which results from incorporating the doping D in a, in a manner which is known per se.

The main condition for the coefficients can in general be presented as follows:

$$a(m_{KA}-3)+b(m_{KB}-3)+x=s(-m_{KC}-2).$$

In the above, m is the respective valence of the incorporated ion of component KA, KB or KC, with any vacancies being assumed to have a valence m=0.

In this context, there are a plurality of possible embodiments:

Firstly, there is the type in which Si replaces part of element B, with Si being introduced by a ferry, namely an oxygen-replacing mechanism, for example by means of nitrogen, so that the following formula applies for stoichiometry: $A_3B_{5-x}Si_x[O_{12-s}N_s]_O$:D, in which the subscript index O makes a statement about the lattice site O. Here, N is an ion of type KC, with in particular $s\leq 1.5$ and $x\leq 1.5$, and preferably x=s.

Secondly, there is the type in which Si partially replaces the element B, Si being introduced by a mechanism which compensates for the charge at lattice site B, so that the following formula applies for stoichiometry: $A_3[B_{5-(x+b)}Si_xKB_b]_BO_{12}$:D, in which the subscript index B makes a statement about the lattice site B. By way of example, Si is introduced together with Mg or Na, specifically both via an oxygen compound as ferry, wherein in particular $b\leq 1$ and $x\leq 1$.

In the case of a different form of introduction of the co-doping charge compensator, for example by means of nitrogen or another element which replaces oxygen, the resulting stoichiometry gives a mixed form of the first type, i.e. for example $A_3[B_{5-x-b}Si_xKB_b]_B[O_{12-s}N_s]_O$:D. One example is x=1 and b=0.5 with B as $Mg^{2+}$ and s=0.5.

Thirdly, there is the type in which Si partially replaces the element B, with Si being introduced by an element as a ferry which partially replaces the lattice site A, i.e. being introduced by a mechanism which replaces A, so that the following formula applies for stoichiometry:

$[A_{3-a}KA_a]_A[B_{5-x}Si_x]_BO_{12}$:D, in which the subscript index A, B makes a statement about the association with the lattice sites of components A and B. Here, in particular x=a. This behavior may manifest itself in particular in the case of divalent ions, such as in particular Mg or Be. However, Na and Li are also suitable as KA and are incorporated in monovalent form, in which case in particular $a\leq 2$ and $x\leq 2$.

Fourthly, there is the type which compensates for the charge compensation solely by the formation of vacancies. In this case, the Si can be associated with vacancies at all lattice sites. The stoichiometry is then: $A_{3-x/3}B_{5-x}Si_xO_{12}$:D, in which in particular $x\leq 0.2$. By way of example, x=0.1.

Of course, mixed forms of all these basic types may also occur. The doping D is normally always to be considered a constituent of lattice site A.

If B=Al, the value x is preferably between $0.01\leq x\leq 1$, and in the case of B=(Al, Ga) with a Ga content of at least 20 mol % of B, the value of x is preferably in the range of from $0.05\leq x\leq 0.25$. Depending on the surrounding conditions, the addition of Si in the garnet structure effects a red or blue shift compared to an Si-free garnet of the same type. Even more surprising is the discovery that the magnitude of the color locus shift is not an unambiguous function of the addition of Si, but rather has more of a dependent relationship. Particularly great shifts can be achieved with relatively low quantities of Si added (x=0.08 to 0.23). Moreover, however, the behavior in individual cases is also dependent on the charge compensator K, in particular the question of its associated lattice site.

The ion radius of the $Si^{4+}$ is similar to that of the $Al^{3+}$, and consequently this component is relatively easy to incorporate instead of $Al^{3+}$. This is one of the main points justifying the surprisingly good replacement function. By contrast, the ion radius of $Mg^{2+}$, which can serve as a charge compensator here, is significantly larger than that of $Al^{3+}$, and consequently it is less easy to incorporate instead of $Al^{3+}$. Therefore, with the system $Si^{4+}$–$Mg^{2+}$, only a relatively small quantity of $Si^{4+}$ can be added.

By contrast, the system $Si^{4+}$ with $N^{3-}$ as charge compensator is much less critical, since the nitrogen ion replaces an oxygen ion of approximately the same size. Therefore, with this system a relatively large quantity of $Si^{4+}$ can be added.

It is advantageous that this mechanism can in part also perform the role of the activator D with a view to a shift in the color locus, so that relatively small quantities of D are required compared to conventional garnets. This applies in particular if D=Ce.

Moreover, the excitability of the new types of phosphor extends over a wide range from approximately 250 nm, preferably 300 nm, up to approximately 550 nm, preferably 490 nm. There are maxima at approximately 350 nm and approximately 460 nm. Therefore, this phosphor is suitable not only for excitation by UV or blue emitting primary light sources, such as LEDs or conventional Hg-based discharge lamps, but also for light sources such as a discharge lamp based on an indium low-pressure discharge or also an indium high-pressure discharge, the resonance lines of which lie, for example, at 304, 325, 410 and 451 nm.

The emission behavior is dependent to a significant extent on the charge compensator. By way of example, the use of nitrogen leads to an increased covalent bond content; in the literature, a behavior of this type is described as what is known as a nephelauxetic effect. An increased crystal field splitting may simultaneously be superimposed on this effect, for example as a result of the higher charge of the $N^{3-}$ ion compared to the $O^{2-}$ ion. The $Si^{4+}$ ion, which is more highly charged than $Al^{3+}$, additionally influences these effects, in a direction which is dependent on the particular details.

The phosphor according to the invention is eminently suitable for use as a green phosphor.

One particular advantage of the phosphors according to the invention is that they have a relatively low temperature quenching. It is surprising that a tetravalent ion such as Si can be incorporated at the lattice site of a trivalent ion without significant efficiency losses.

BRIEF DESCRIPTION OF THE DRAWINGS

The invention is to be explained in more detail below on the basis of a plurality of exemplary embodiments. In the drawings.

PREFERRED EMBODIMENT OF THE INVENTION

Figure 1:
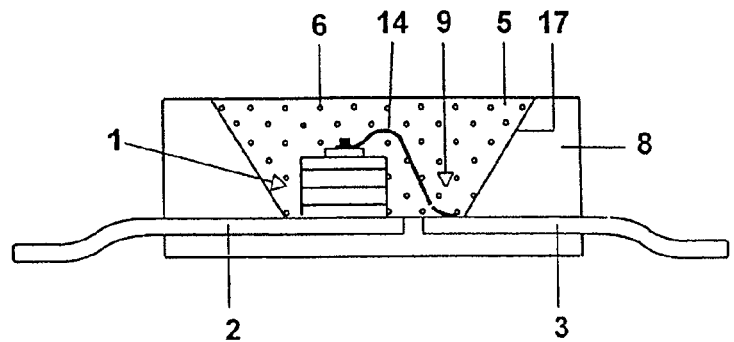
FIG. 1 shows a semiconductor component which serves as light source (LED) for white or green light.

For use in a warm-white LED together with a GaInN chip, by way of example a similar structure to that described in U.S. Pat. No. 5,998,925 is used. The structure of a light source of this type for white light is specifically shown in FIG. 1. The light source is a semiconductor component (chip 1) of type InGaN with a peak emission wavelength of 460 nm and a first and second electrical connection 2, 3 embedded in an opaque basic housing 8 in the region of a recess 9. One of the connections 3 is connected to the chip 1 via a bonding wire 14. The recess has a wall 17 which serves as reflector for the primary radiation of the chip 1. The recess 9 is filled with a potting compound 5, which as its main constituents contains an epoxy casting resin (for example 80 to 90% by weight) and phosphor pigments 6 (for example less than 15% by weight). Further small fractions are attributable, inter alia, to Aerosil. The phosphor pigments consist of pigments of silicon-containing garnet. These emit yellow light and are mixed with a remainder of the unconverted blue of the primary radiation to form white. The same structure is also suitable for creating a green-emitting LED, in which case the blue primary radiation is completely converted.

Figure 2:
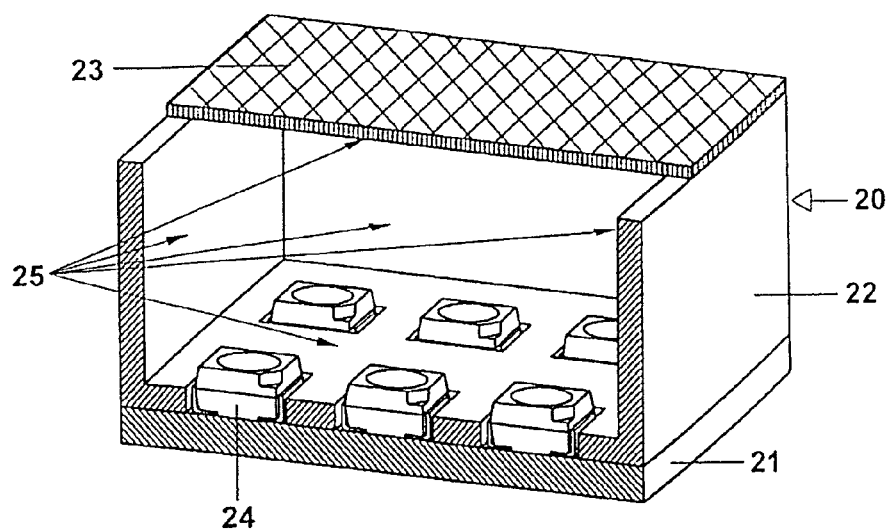
FIG. 2 shows an illumination unit with phosphors in accordance with the present invention.

FIG. 2 shows part of a surface-light fitting 20 as illumination unit. It comprises a common support 21, to which a cuboidal outer housing 22 is adhesively bonded. Its upper side is provided with a common cover 23. The cuboidal housing has cutouts in which individual semiconductor components 24 are accommodated. They are UV-emitting light-emitting diodes with a peak emission of typically 340 nm. The conversion into white light takes place by means of conversion layers which are positioned directly in the casting resin of the individual LEDs, in a similar manner to that described in FIG. 1, or layers 25 which are arranged on all surfaces which are accessible to the UV radiation. These include the inner surfaces of the side walls of the housing, of the cover and of the base part. The conversion layers 25 consist of three phosphors which emit in the red, green and blue spectral regions using the phosphors according to the invention.

First of all, Table 1 shows ion radii of a few important elements which are incorporated in the garnet. The relative quantum efficiencies QE of some Si garnets of type $Y(Al_{3-x}Si_xGa_2)G:Ce$ (4%) are shown in Table 2.

Figure 3:
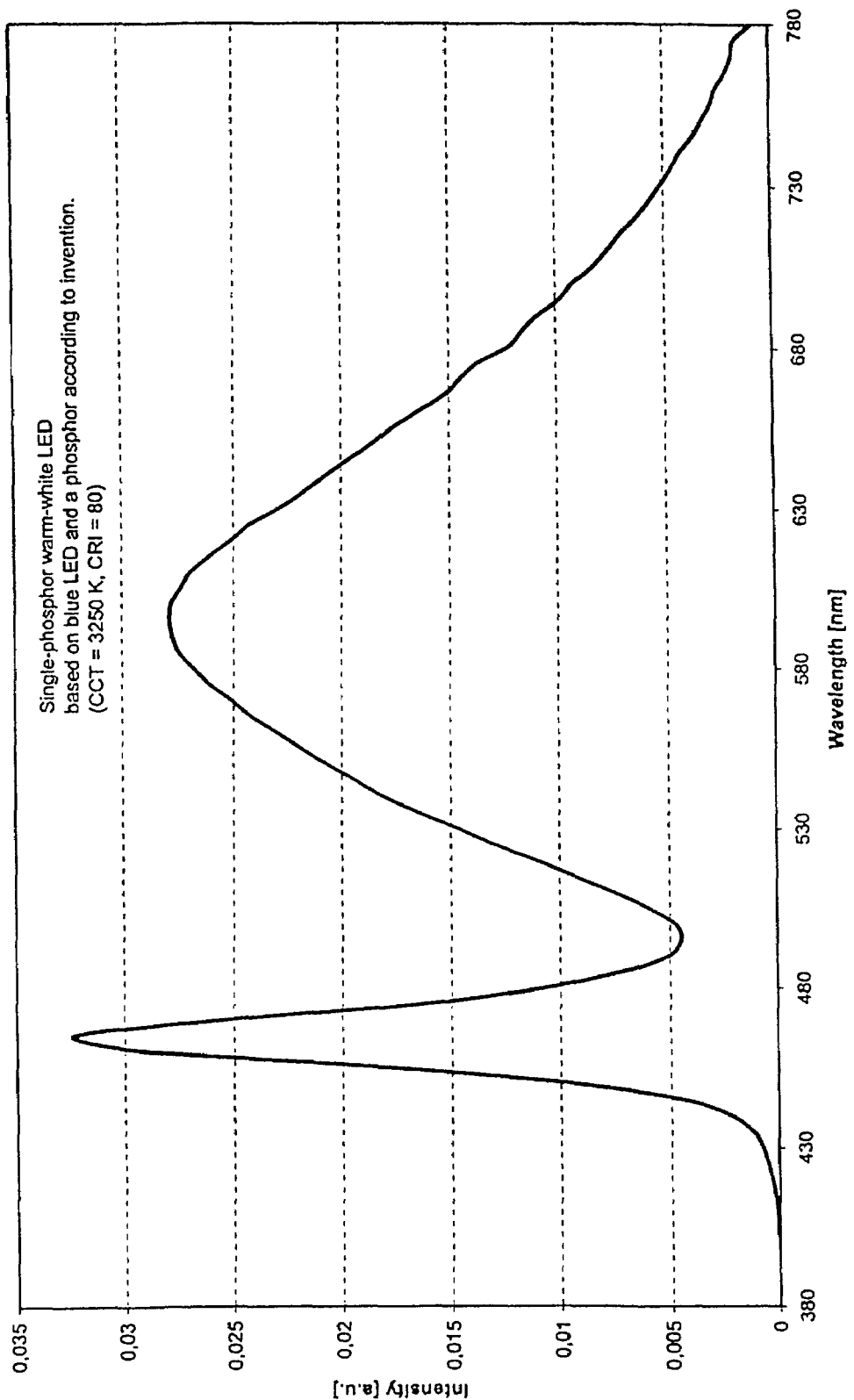
FIG. 3 shows the emission spectrum of a warm-white LED with Si garnet.

FIG. 3 shows the emission spectrum of a warm-white LED which uses a single Si garnet as conversion agent. The primary radiation is 460 nm, resulting in a color temperature of 3250 K and a color rendering index of 80.

Figure 4:
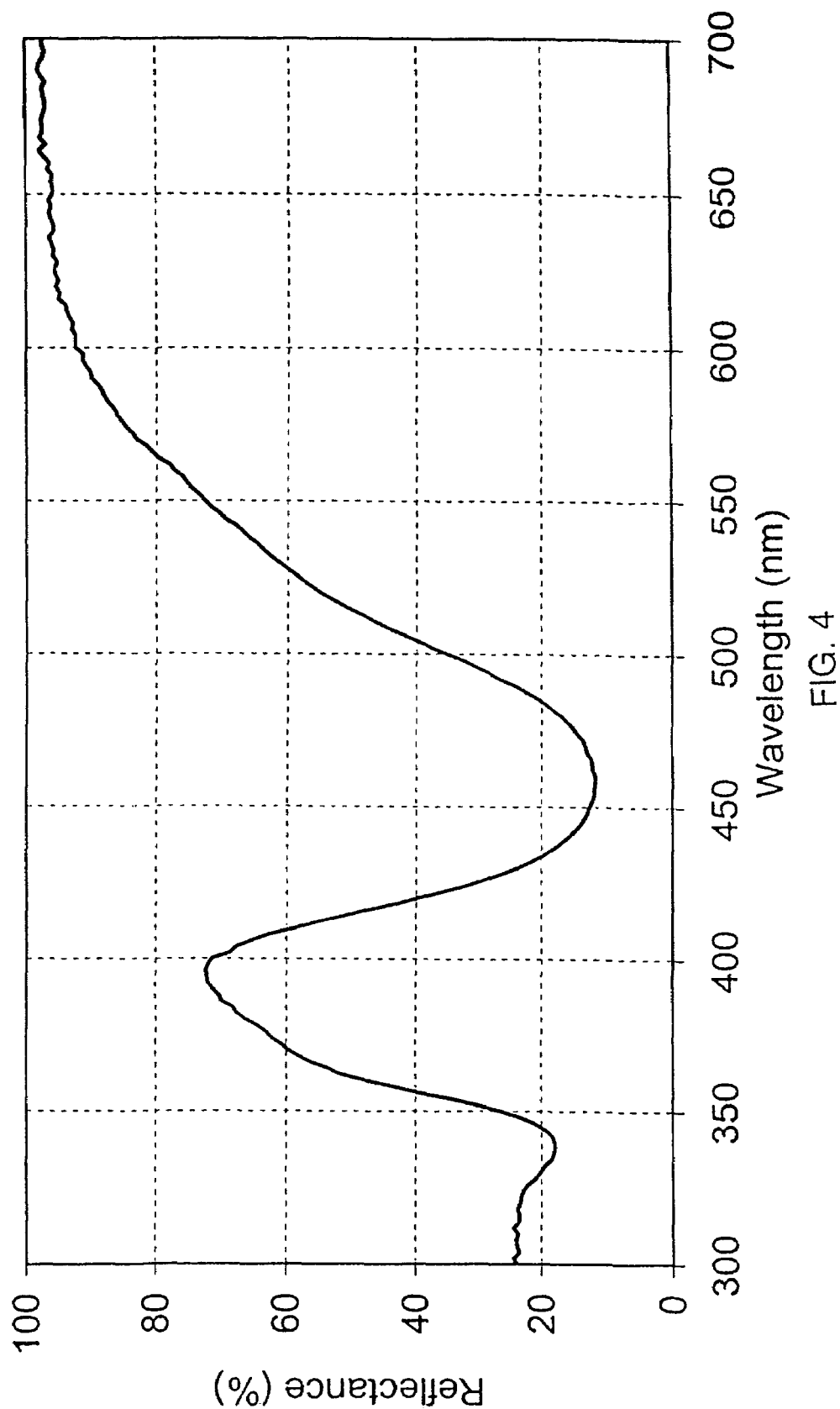
FIG. 4 shows the reflectance of an Si garnet.

FIG. 4 shows the reflectance of an Si garnet as a function of the wavelength. This garnet is $Y_3Al_{4.9}Si_{0.1}O_{11.9}N_{0.1}$:Ce.

Figure 5:
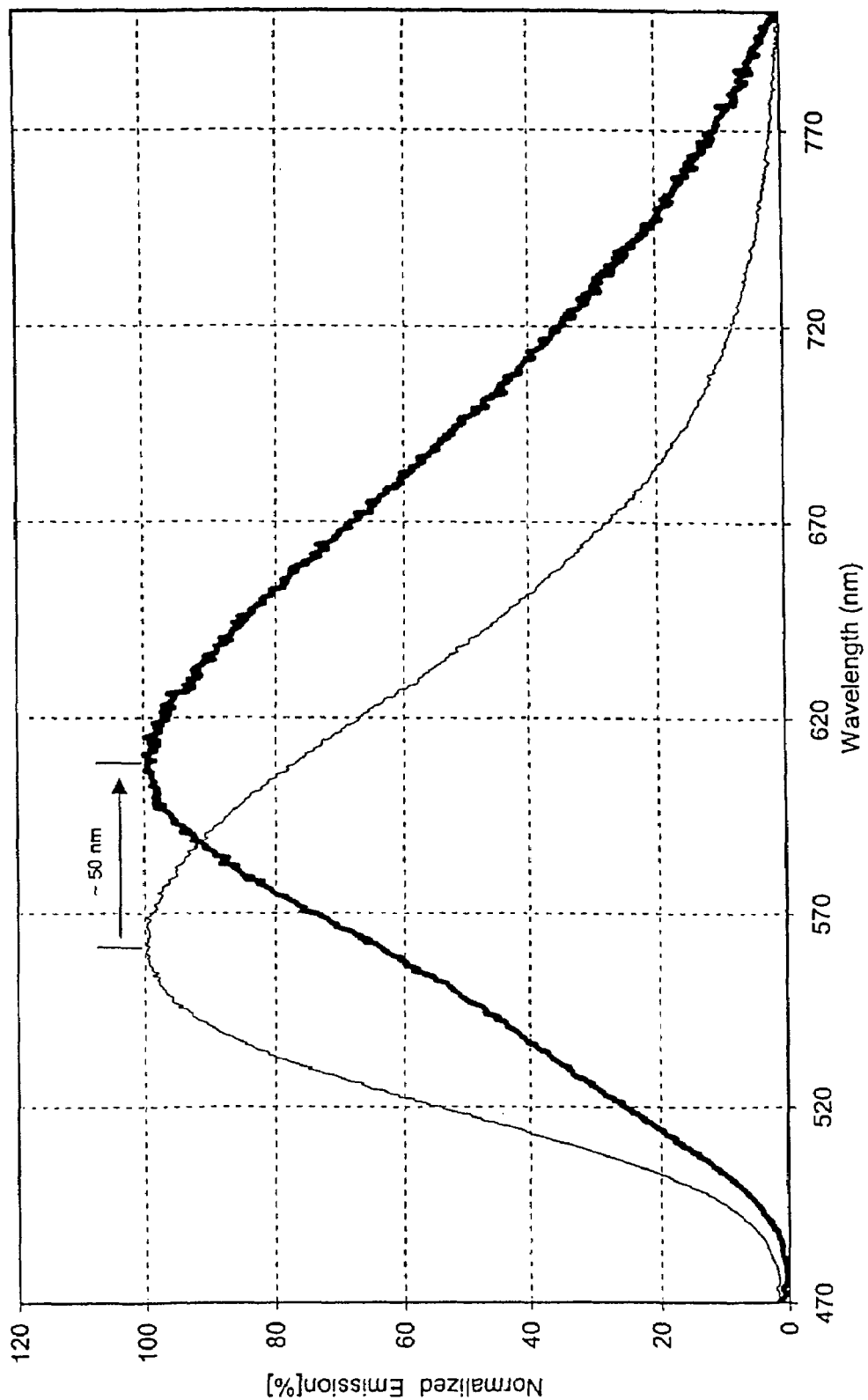
FIG. 5 shows the emission properties of an Si garnet.

FIG. 5 shows the emission properties of an Si garnet (x=0.25), namely $Y_3Al_{4.75}Si_{0.25}O_{11.75}N_{0.25}$:Ce, as a function of the wavelength (in nm) in direct comparison with the emission properties of the same garnet without the addition of Si (x=0), namely YAG:Ce. The considerable shift in the peak wavelength is amazing. A typical value for the cerium doping is from 0.5 to 4% of A.

Figure 6:
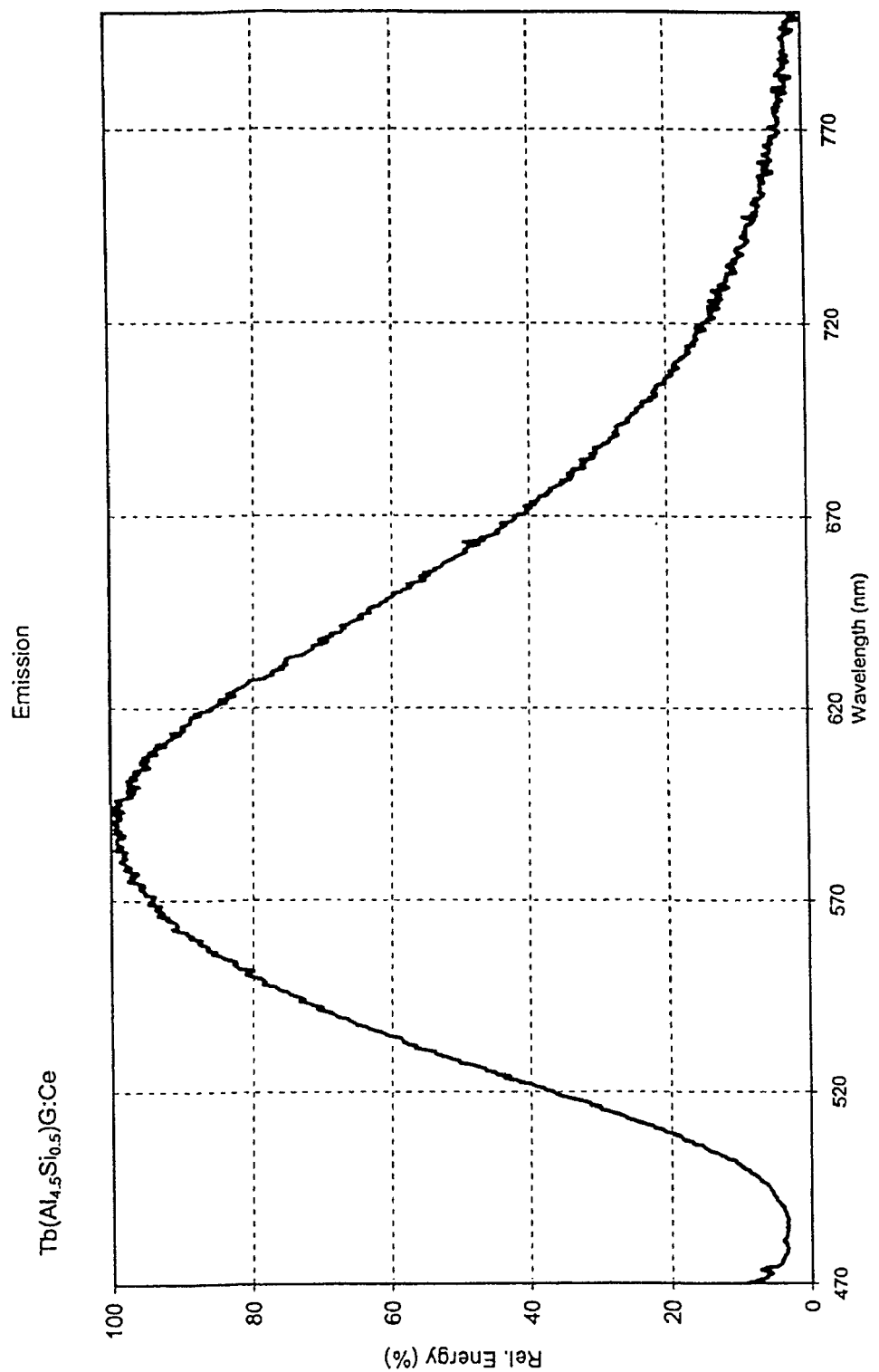
FIG. 6 shows the emission properties of a further Si garnet.
Figure 7:
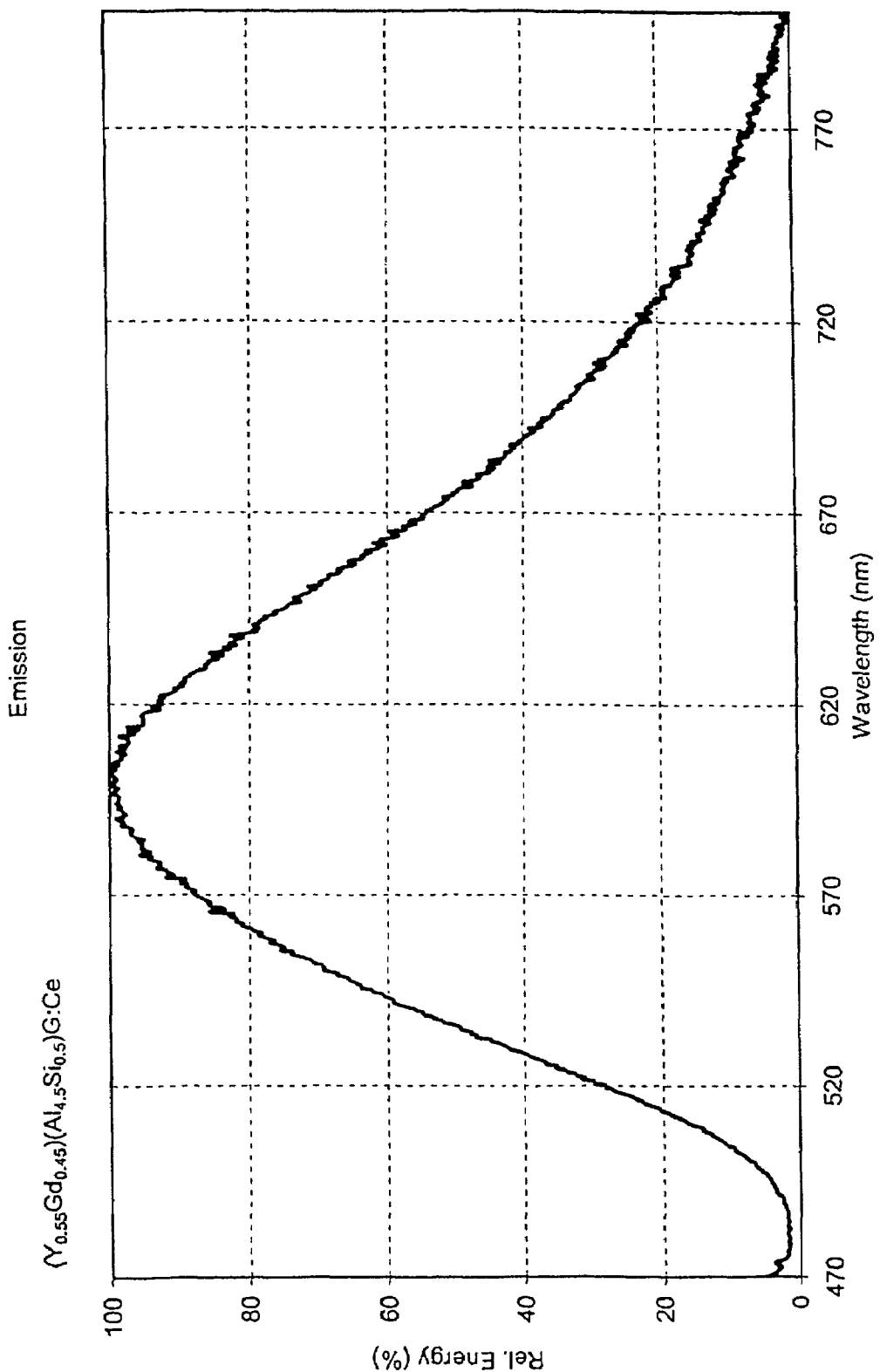
FIG. 7 shows the emission properties of a further Si garnet.

FIG. 6 shows the emission properties of the Si garnet $Tb_3(Al_{4.5}Si_{0.5})O_{11.5}N_{0.5}$:Ce as a function of the wavelength. FIG. 7 shows the emission properties of the Si garnet $(Y_{0.55}Gd_{0.45})_3(Al_{4.5}Si_{0.5})O_{11.5}N_{0.5}$:Ce as a function of the wavelength.

Figure 8:
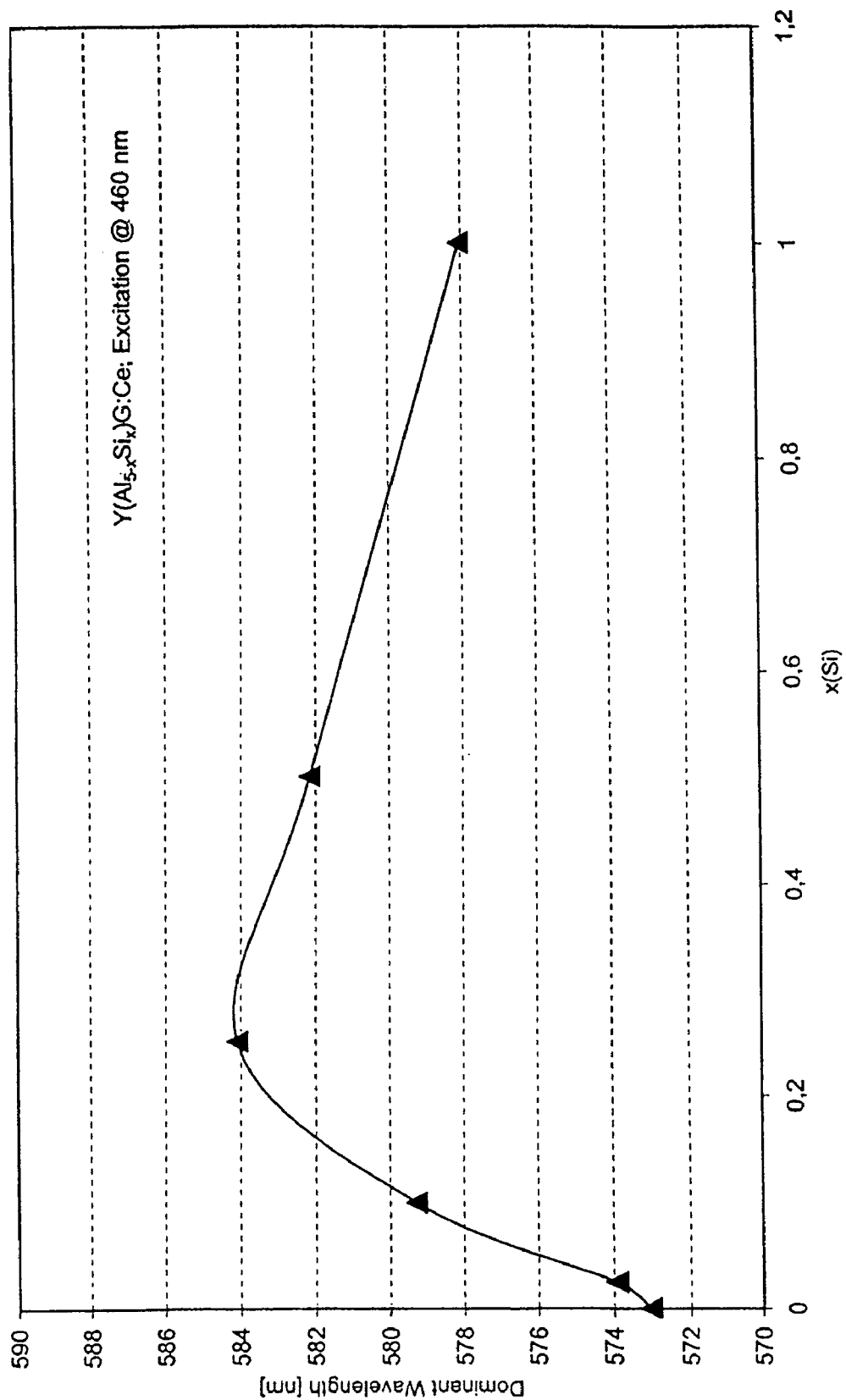
FIG. 8 shows the shift in the dominant wavelength of an Si garnet.

FIG. 8 shows the shift in the dominant wavelength (nm) as a function of the content x of Si at 460 nm for the phosphor $Y_3(Al_{5-x}Si_x)(O_{12-x}N_x)$:Ce. Surprisingly, the maximum is at approximately 0.25. Therefore, the function is not linear.

Figure 9:
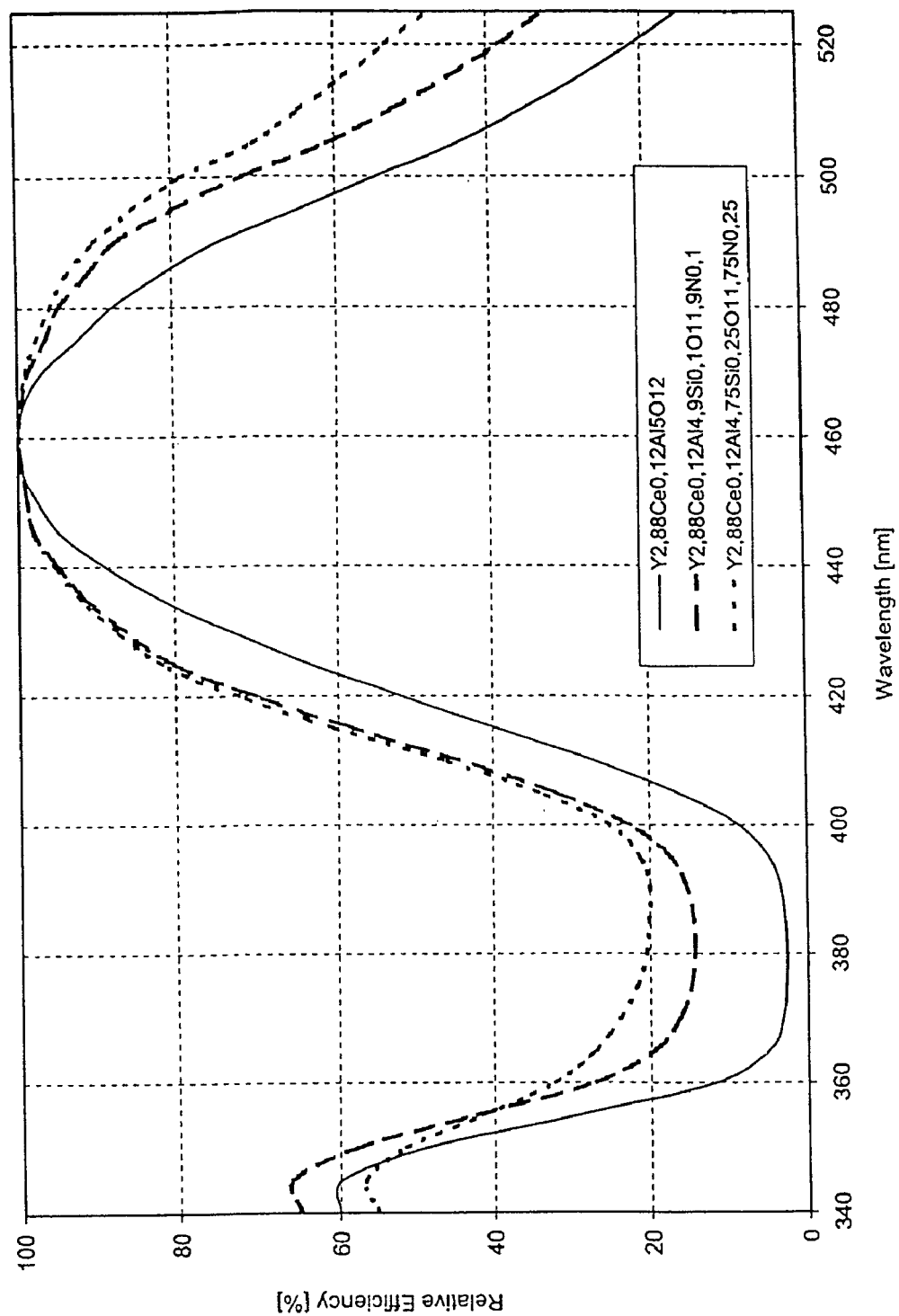
FIG. 9 shows a spectrum of an LED lamp

FIG. 9 shows the change in the efficiency and emission width of various phosphors of type $Y_{2.88}Ce_{0.12}Al_5O_{12}$ (i.e. YAG:Ce) when AlO is exchanged for SiN.

Figure 10:
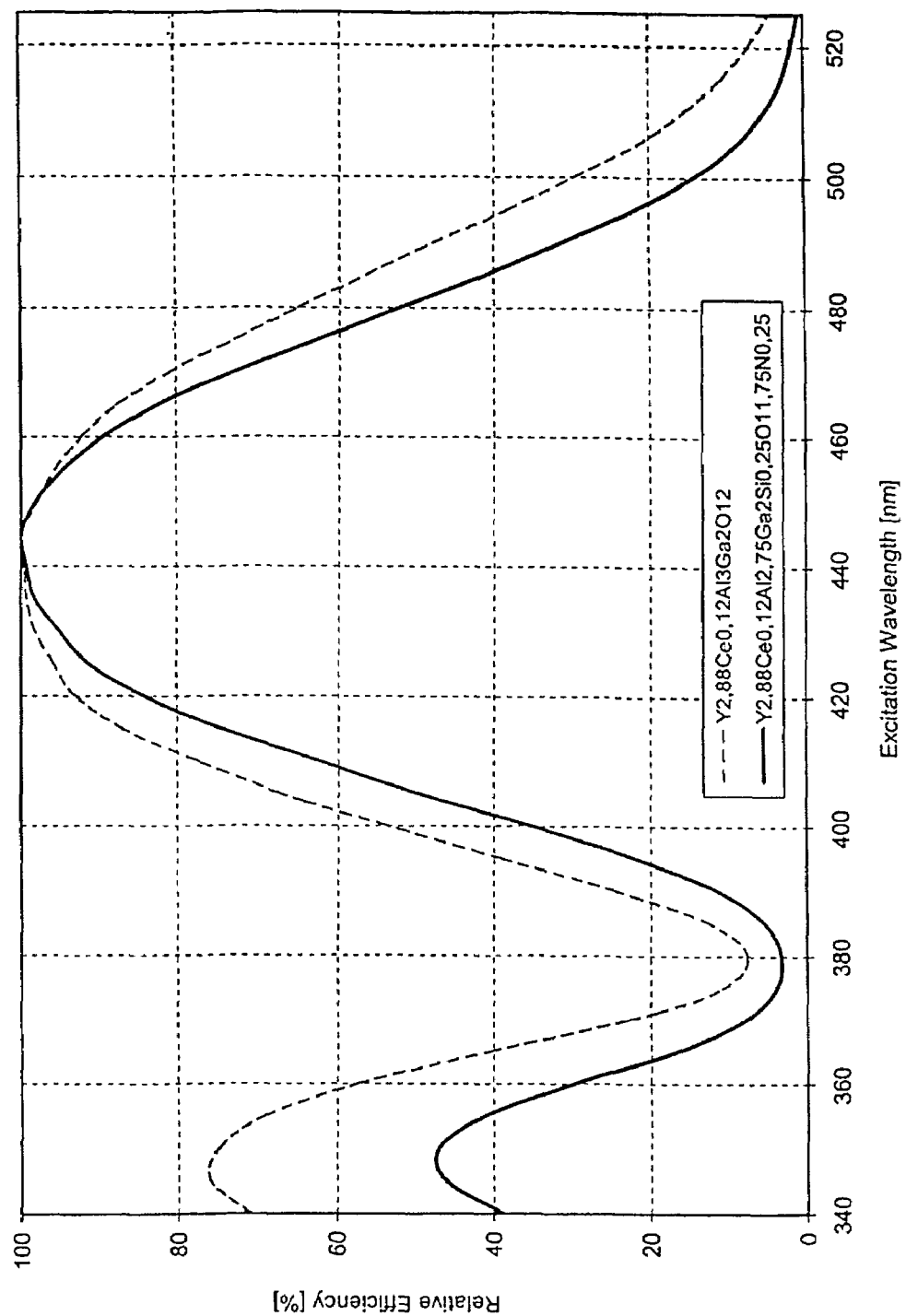
FIG. 10 shows a spectrum of an LED lamp

FIG. 10 shows the change in efficiency and emission width for various phosphors of type $Y_{2.88}Ce_{0.12}Al_3Ga_2O_{12}$ (i.e. Y(Al,Ga)G:Ce) when Si is added as SiN as a replacement for AlO. Surprisingly, the addition of gallium makes the properties of this system completely different from those of pure YAG:Ce.

Figure 11:
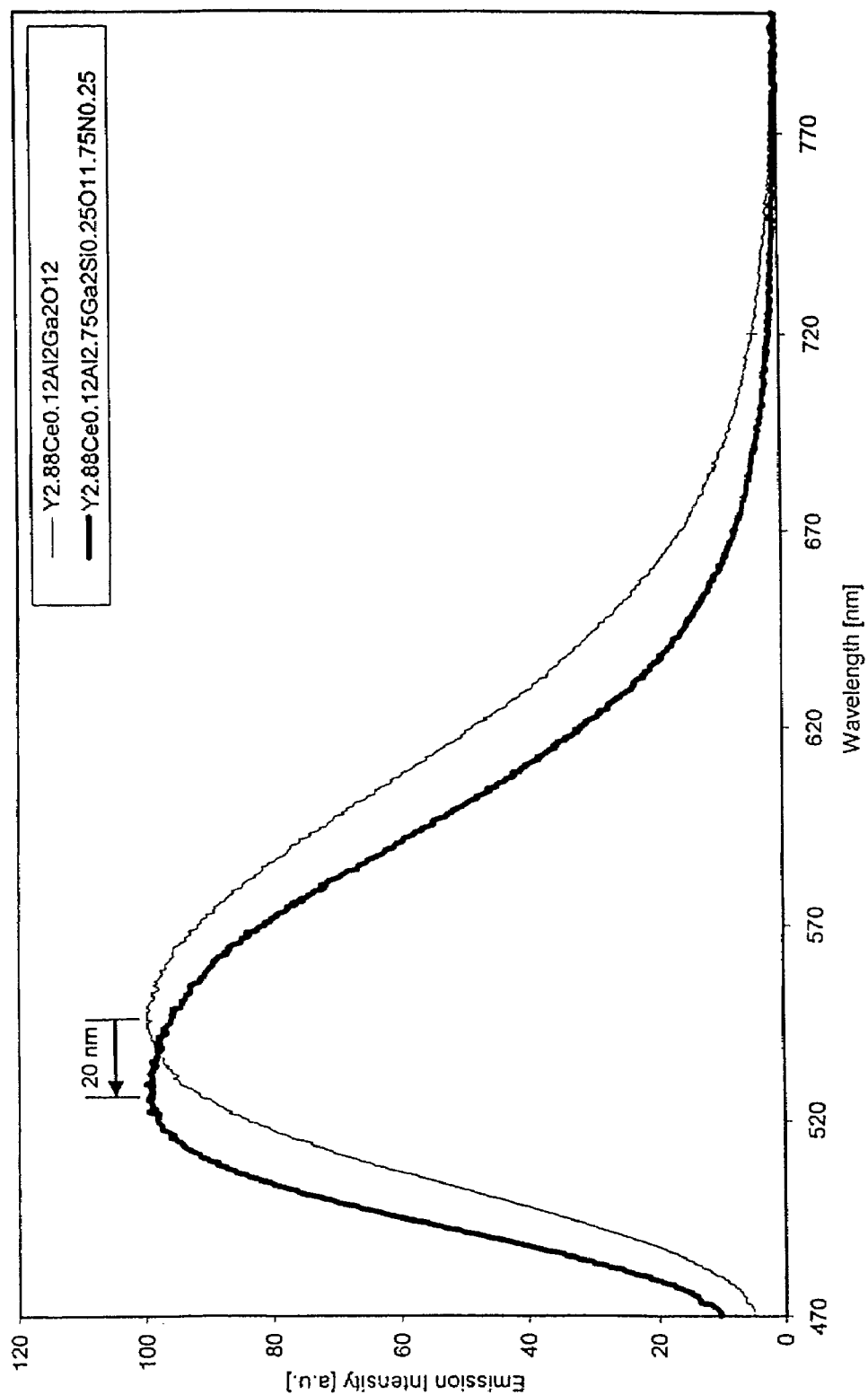
FIG. 11 shows a spectrum of an LED lamp

FIG. 11 shows the emission properties of an Si garnet (x=0.25) as a function of the wavelength (in nm) as a direct comparison with the emission properties of the same garnet without the addition of Si (x=0). Not only the great shift in the peak wavelength but also the fact that this shift is in precisely the opposite direction to in FIG. 5, are amazing. The details of this unusual behavior are not yet fully understood.

Figure 12:
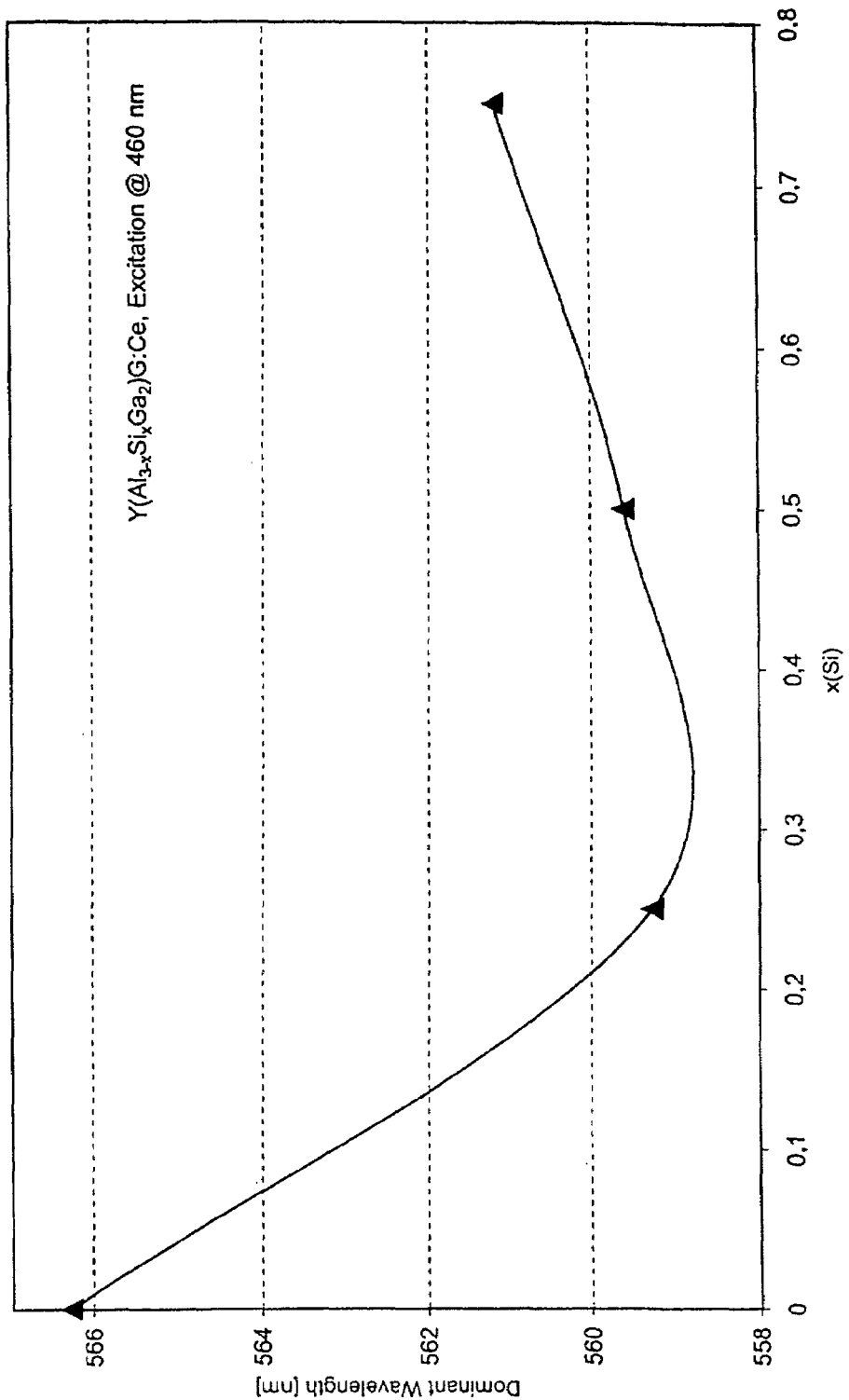
FIG. 12 shows the shift in the dominant wavelength of an Si garnet.

FIG. 12 shows the shift in the dominant wavelength (nm) as a function of the content x of Si at 460 nm excitation for the phosphor $Y_3(Al_{3-x}Ga_2Si_x)O_{12}$:Ce. Surprisingly, the maximum is at approximately 0.25, and therefore the function is not linear.

Figure 13:
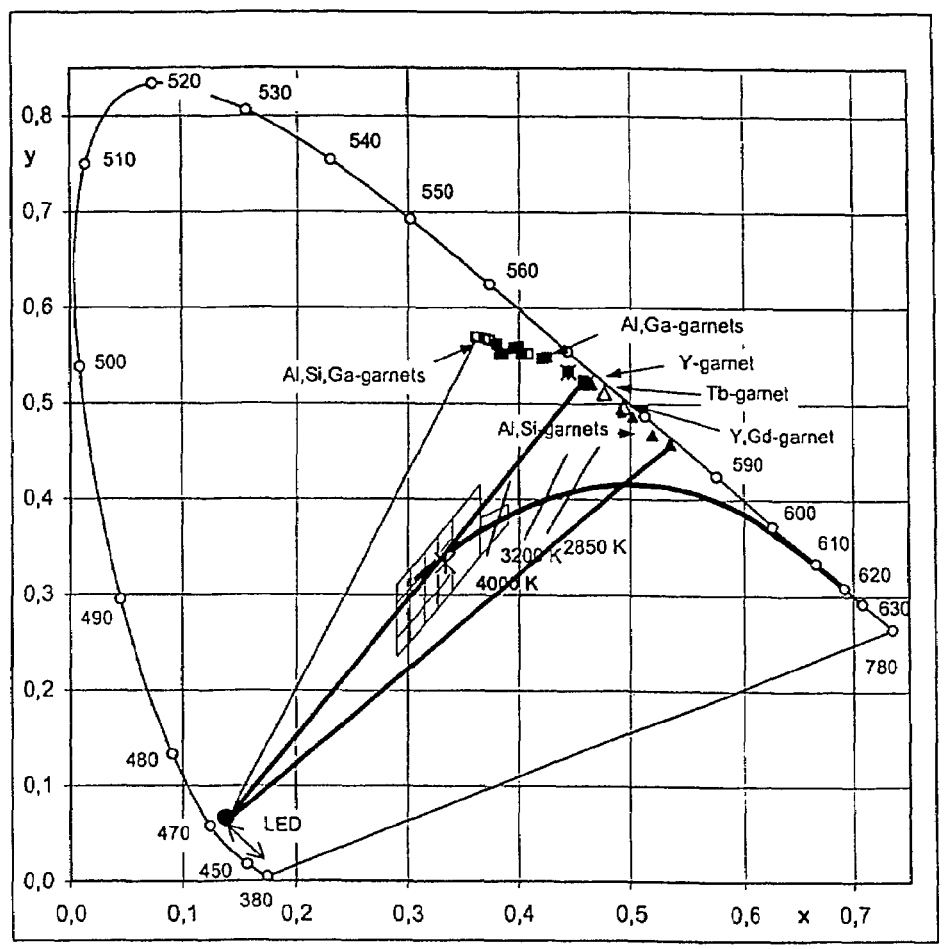
FIG. 13 shows the chromaticity diagram for a blue primary LED with Si garnet system.

FIG. 13 shows the chromaticity diagram (CIE) with the coordinates x, y for a system composed of blue LED (peak emission at 450 to 470 nm) and Si garnets according to the invention. It can be seen that in the case of conventional garnets, it is now possible for the first time to realize systems with a warm-white luminous color of typically 3200 or 2850 K or below in a simple way by means of a single phosphor. Candidates for this phosphor are in particular Si garnets based on the garnets (unshaded triangles) of the rare earths Y, Tb and Gd, which can be shifted to the right toward longer wavelengths by means of the addition of Si (solid triangles). Conversely, green LEDs can be successfully realized by adding Si to Ga-containing garnets (Al:Ga ratio is preferably between 0.5 and 2.5), starting from YAG:Ce, in which case the peak wavelength migrates to the left toward shorter wavelengths.

Therefore, Si garnets are ideally suited to being specifically adapted to customer's requirements.

Figure 14:
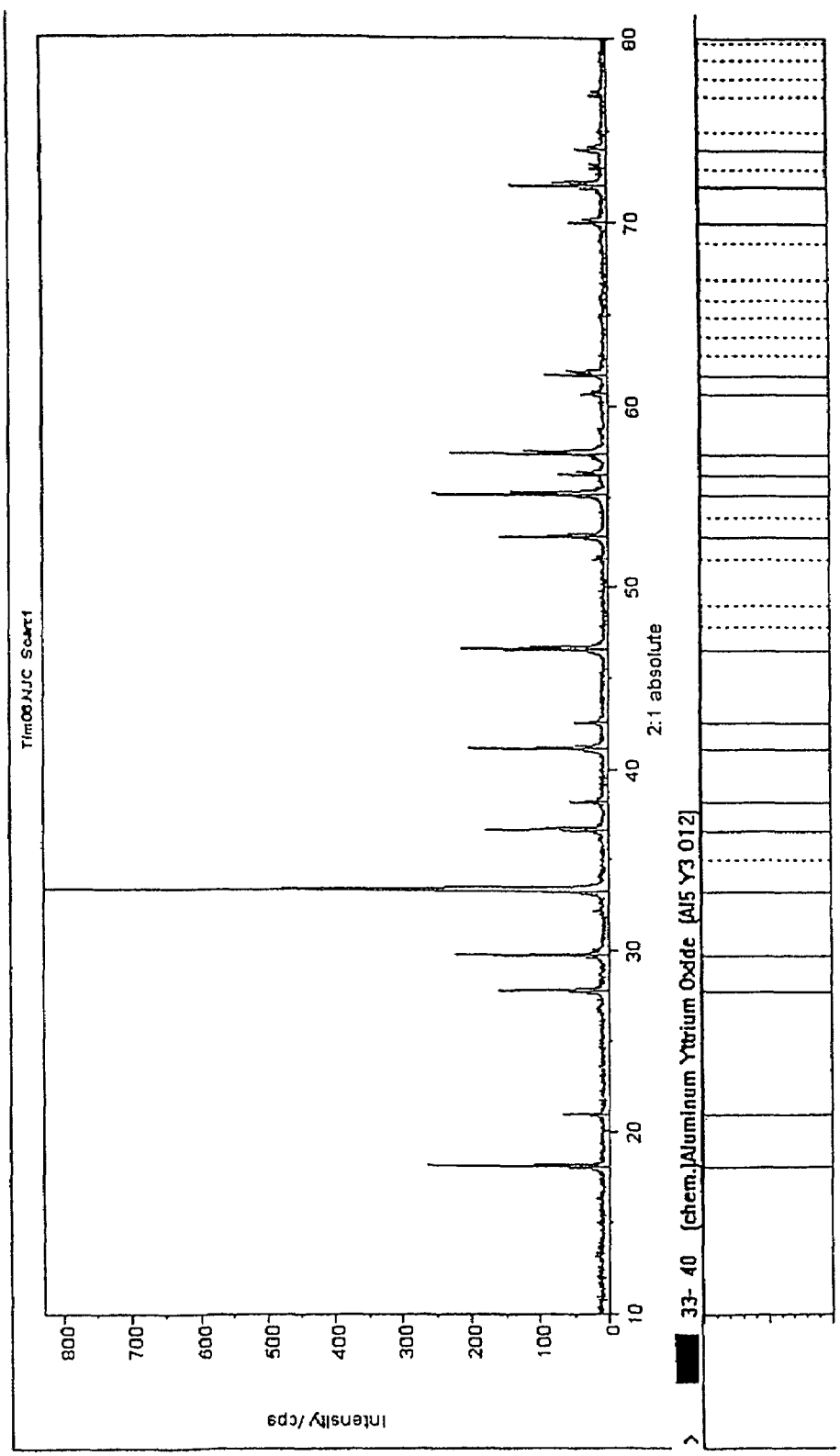
FIGS. 14-17 show an X-ray diffractogram for various Si garnets.
Figure 15:
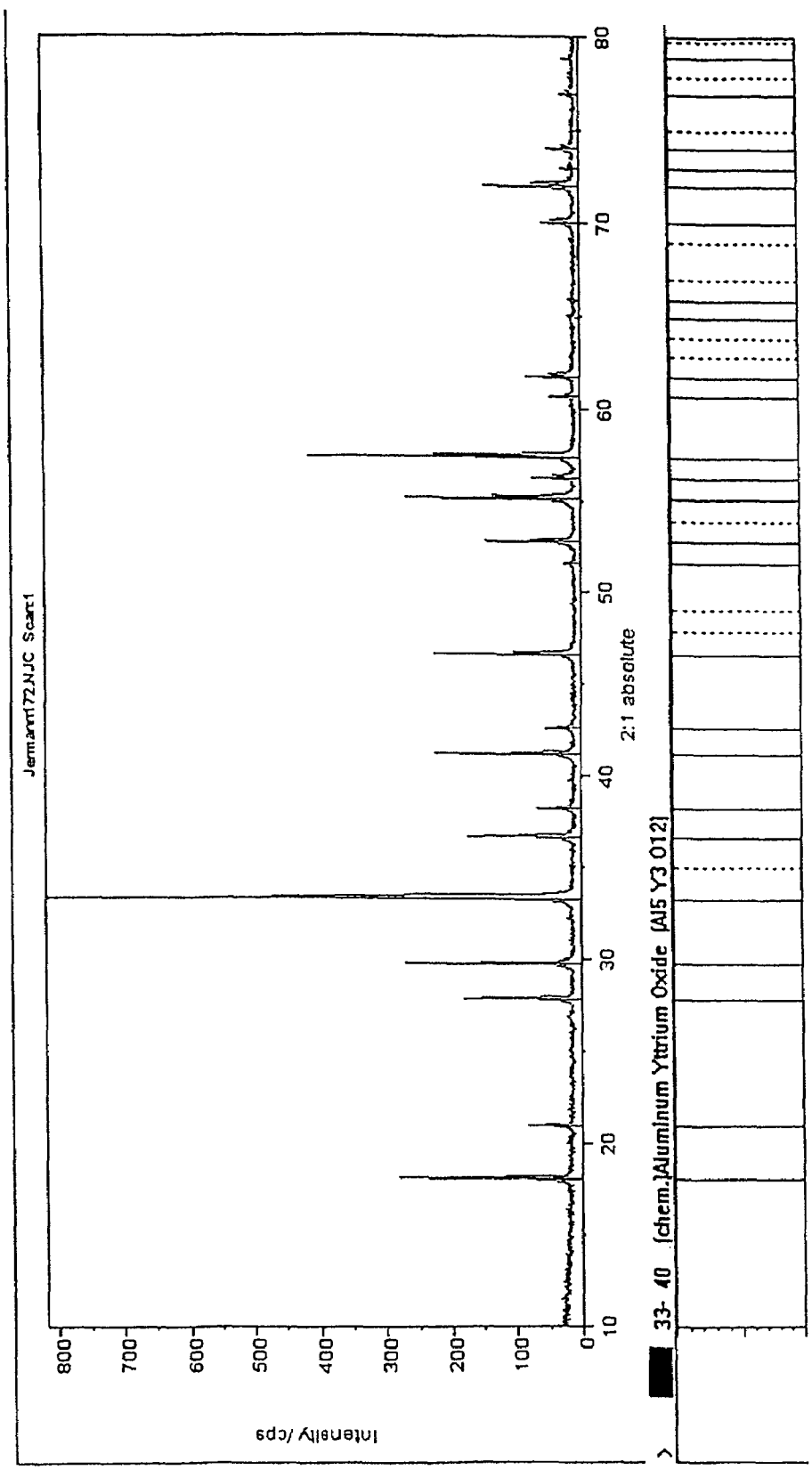

FIG. 14 shows an X-ray diffractogram for YAG:Ce with an Si content x=0.1, which illustrates the typical garnet structure, compared to conventional YAG:Ce, cf. lower bar. FIG. 15 shows the same for a Si content of x=0.25.

Figure 16:
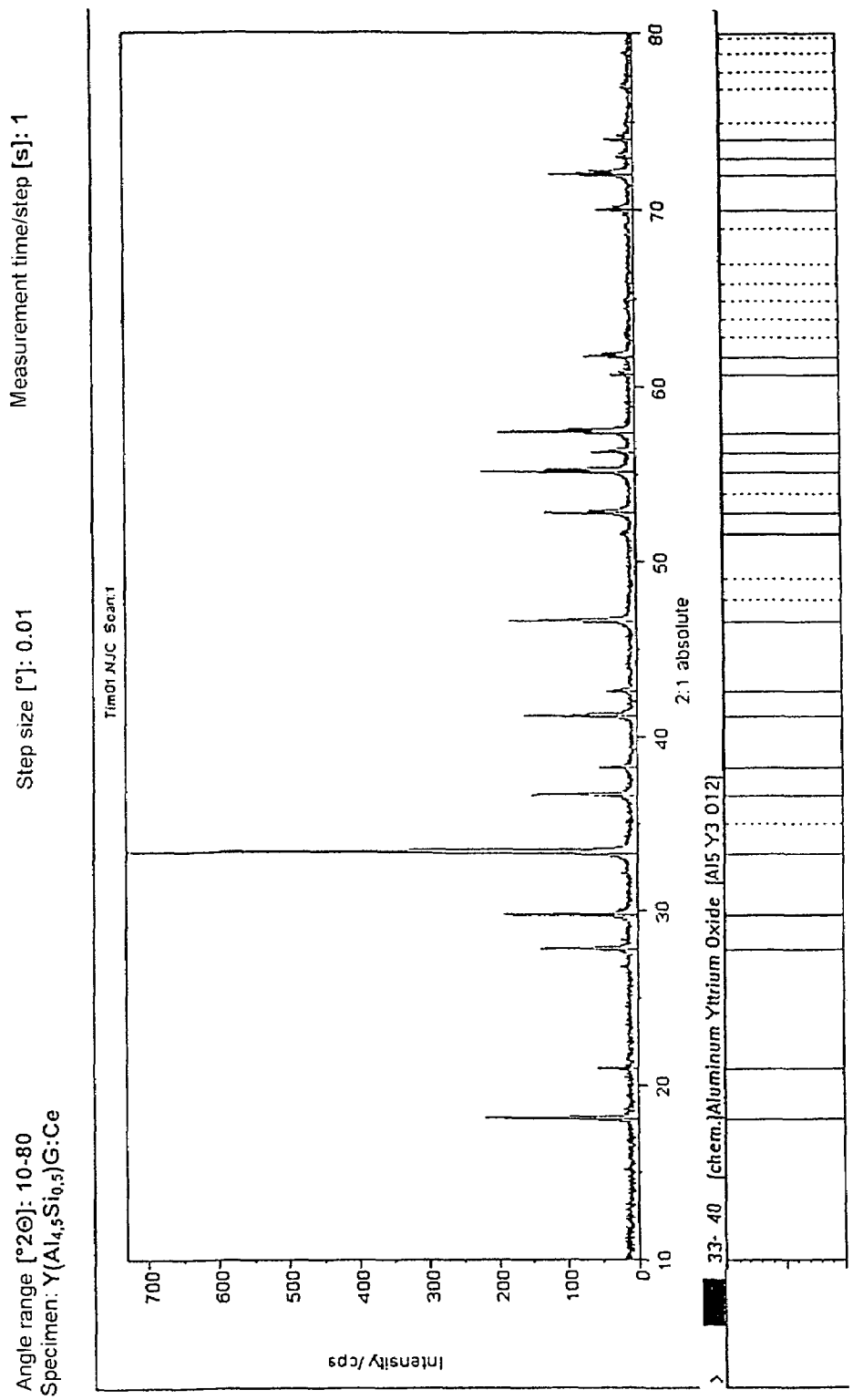
Figure 17:
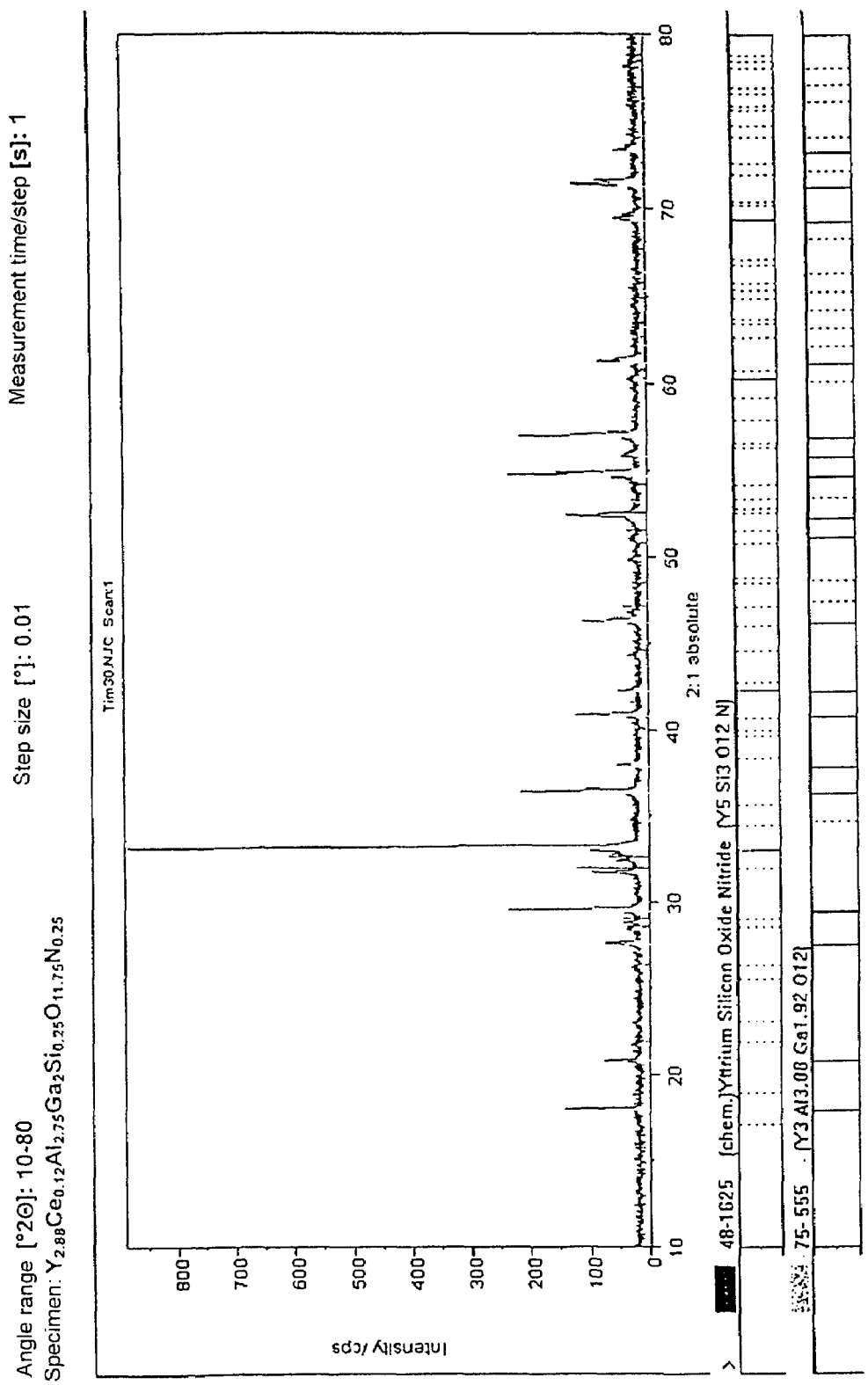

FIG. 17 shows an X-ray diffractogram for $Y_3Al_{3-x}Ga_2Si_xO_{12}$:Ce with a Si content x=0.25, which illustrates the typical garnet structure, compared to conventional YAG:Ce, cf. the lower bar, with an yttrium oxynitride being indicated as a second bar, but the structure of this material is not suitable for the phosphor under investigation. FIG. 16 shows the same for an Si content of x=0.5.

A typical production process is fundamentally based on the standard production of YAG:Ce, with the following example of a modification:

The batch is selected as follows in accordance with Table 3:

This batch is mixed for approx. 40 min in a mortar mill; it is then calcined at 1460-1560° C. for several hours (typically 3 h). The precise temperature depends on the composition and in particular on the addition of flux. Boric acid $H_3BO_3$ is typically added.

Figure 18:
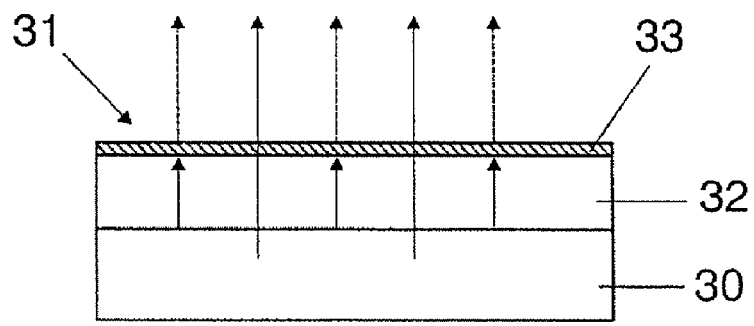
FIG. 18 shows an example of an OLED.

FIG. 18 shows a further application, as is already known in principle from U.S. Pat. No. 6,700,322. In this case, the phosphor according to the invention is used in combination with an OLED. The light source is an organic light-emitting diode 31, comprising the actual organic sheet 30 and a transparent substrate 32. The sheet 30 emits in particular blue primary light, generated for example by means of PVK:PBD:Coumarin. The emission is partially converted into yellow, secondary emitted light by a covering layer, formed from a layer 33 of the phosphor according to the invention, so that overall a white emission is realized by color mixing of the primary and secondary emitted light. It is preferable for the phosphor according to the invention to interact with a blue-green primary emission. This means that the primary emission is at 480 to 505 nm peak wavelength. It may particularly preferably also be realized by an organic phosphor sheet which has two peaks, one in the blue at 430 to 490 nm and another at 495 to 520 nm, so that overall the dominant wavelength is in the blue-green. This system achieves amazing color rendering values (Ra better than 85) at a color temperature of from 4000 K to 4600 K using just two phosphors (the sheet and the modified garnet phosphor). The OLED substantially comprises at least one layer of a light-emitting polymer or of what are known as small molecules between two electrodes, which consist of materials that are known per se, such as for example ITO as anode, and a highly reactive metal, such as for example Ba or Ca, as cathode. A plurality of layers are often also used between the electrodes, serving either as a hole transport layer (for example Baytron-P, commercially available from HC Starck) or also serve as electron transport layers in the region of the small molecules.

The emitting polymers used are, for example, polyfluorenes or polyspiro materials.

A further application for the phosphor according to the invention is in fluorescent lamps, where it is applied to the inner side of the bulb, as is known per se, if appropriate in combination with further phosphors which are known per se, such as for example halophosphates. In this case, the excitation is effected by means of the known Hg lines, in particular at 254 nm.

Figure 19:
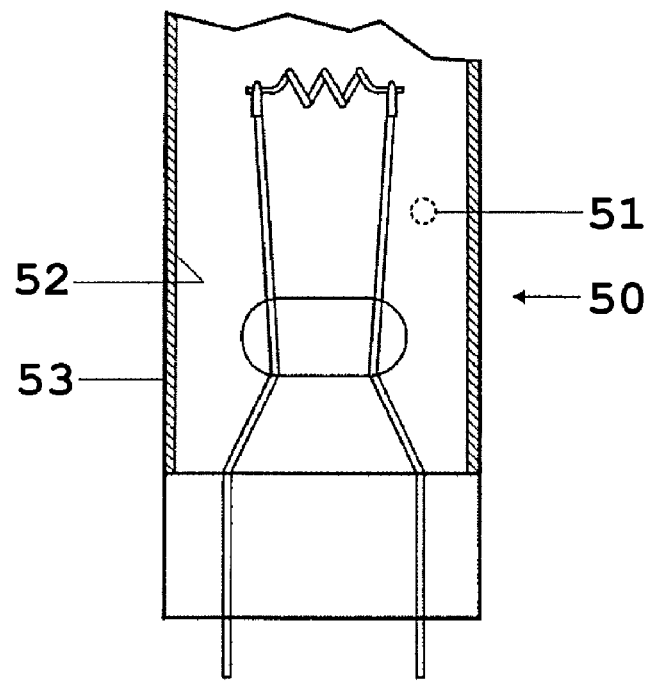
FIG. 19 shows a low-pressure lamp with indium fill using a garnet.

One specific application is an indium lamp. FIG. 19 shows a low-pressure discharge lamp 50 with a mercury-free gas fill 51 (in the form of a diagrammatic illustration) which contains an indium compound and a buffer gas similar to WO 02/10374, with a layer 52 of Si-containing garnet having been applied to the lamp wall 53. The very particular advantage of this arrangement is that this modified garnet is well matched to the indium radiation, since the latter has significant components both in the UV and in the blue spectral region, both of which are equally well absorbed by this garnet, which makes it superior to the previously known phosphors for this application. These known phosphors significantly absorb either only the UV radiation or the blue radiation of the indium, and consequently the indium lamp according to the invention is significantly more efficient.

This statement also applies to an indium lamp based on high pressure, as is known per se from U.S. Pat. No. 4,810,938.

A further application is excitation in electroluminescent lamps by a blue or blue-green emitting electroluminescent phosphor with a peak emission between 440 and 520 nm.

Figure 20A:
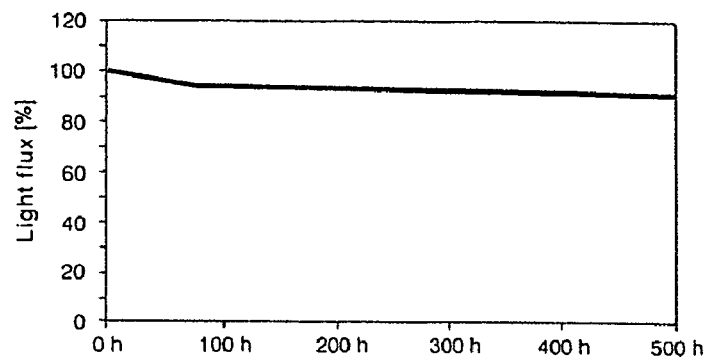
FIG. 20 shows the long-term stability of a warm-white LED.
Figure 20B:
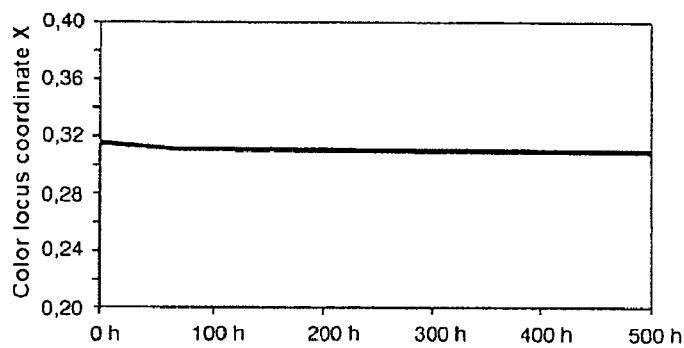
Figure 20C:
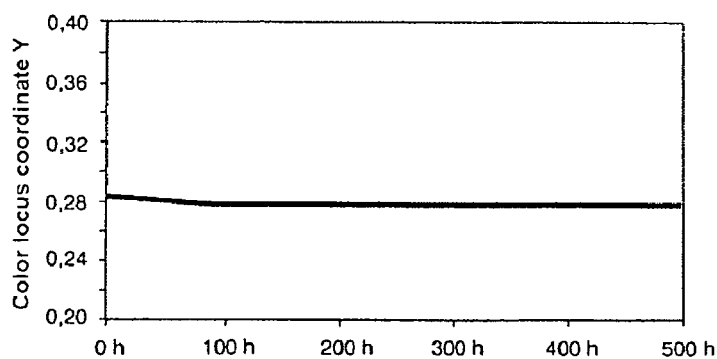

FIG. 20 shows the good long-term stability of a warm-white LED using the phosphor discussed in FIG. 3. Both the light flux (FIG. 20a) and the color coordinates x and y (FIGS. 20b, 20c) remain virtually stable over 500 hours.

TABLE 1 ion radii (typical value) in nm

|  | CN4 tetrahedral | CN6 octahedral |
|---|---|---|
| $Mg^{2+}$ | — | 0.07 |
| $Al^{3+}$ | 0.04 | 0.05 |
| $Ga^{3+}$ | 0.05 | 0.06 |
| $Si^{4+}$ | 0.04 | 0.05 |
| $O^{2-}$ | 0.12 | 0.13 |
| $N^{3-}$ | 0.13 | 0.17 |

TABLE 2 relative quantum efficiency for $Y(Al_{3-x}Si_xGa_2)G:Ce$ at 460 nm excitation

| X (Si) | rel. QE in % | Dominant wavelength (nm) |
|---|---|---|
| 0 | 100 | 566 |
| 0.25 | 101 | 559 |
| 0.50 | 103 | 560 |
| 0.75 | 100 | 561 |

TABLE 3

| Component | Purity | Source of procurement |
|---|---|---|
| $Y_2O_3$ | 4N | Rhodia |
| $CeO_2$ | 3N5 | Rhodia |
| $Al_2O_3$ | 4N | Alfa A |
| $Ga_2O_3$ | 5N | Alfa A |
| $SiO_2$ | Aerosil | Ox 50 |
| $H_3BO_3$ |  | Merck |

The invention claimed is:

1. A phosphor with a garnet structure and having a composition represented by a formula $[A_{3-a}KA_a]_A[B_{5-b-x}KB_bSi_x]_B[O_{12-s}KC_s]_O$:D wherein A is a rare earth, B is selected from Al, Ga or a combination thereof, part of B is replaced by Si in a proportion x, D is a rare earth, and KA, KB, KC are charge-compensating components located at lattice sites A, B and O, respectively; and in which the following relationship applies:

$a(m_{KA}-3)+b(m_{KB}-3)+x=s(-m_{KC}-2)$, where m is the valence of the incorporated ion of the charge-compensating components and s>0.

2. The phosphor of claim 1 wherein KC is N.

3. The phosphor of claim 2 wherein $s \leq 1.5$ and $x \leq 1.5$.

4. The phosphor of claim 2 wherein x=s.

5. The phosphor of claim 1 wherein $s \leq 2x$.

6. The phosphor of claim 1 wherein A=Y, Tb, Gd, La, or Lu, alone or in combination.

7. The phosphor of claim 1 wherein D=Ce, Pr, or Eu, alone or in combination.

8. The phosphor of claim 7 wherein D=Ce, Pr, or Eu, alone or in combination.

9. The phosphor of claim 1 wherein $x \leq 1$.

10. The phosphor of claim 1 wherein one or more of the elements Mg, N, Be, Na or Li function as one of the charge compensators KA, KB, or KC.

11. A phosphor with a garnet structure and having a composition represented by a formula $A_{3-x/3}B_{5-x}Si_xO_{12}$:D wherein A is a rare earth, B is selected from Al, Ga or a combination thereof, part of B is replaced by Si in a proportion x, and D is a rare earth.

12. The phosphor of claim 11 wherein $x \leq 0.2$.

13. The phosphor of claim 11 wherein A=Y, Tb, Gd, La, or Lu, alone or in combination.

14. The phosphor of claim 11 wherein D=Ce, Pr, or Eu, alone or in combination.

15. The phosphor of claim 13 wherein D=Ce, Pr, or Eu, alone or in combination.

16. A phosphor with a garnet structure and having a composition represented by a formula $A_3B_{5-x}Si_x[O_{12-s}N_s]_O$:D wherein A is a rare earth, B is selected from Al, Ga or a combination thereof, part of B is replaced by Si in a proportion x, D is a rare earth and $0<s \leq 2x$.

17. The phosphor of claim 16 wherein $s \leq 1.5$ and $x \leq 1.5$.

18. The phosphor of claim 16 wherein x=s.

19. The phosphor of claim 16 wherein A=Y, Tb, Gd, La, or Lu, alone or in combination.

20. The phosphor of claim 16 wherein D=Ce, Pr, or Eu, alone or in combination.

21. The phosphor of claim 19 wherein D=Ce, Pr, or Eu, alone or in combination.

22. The phosphor of claim 1 wherein x=0.1 to 0.5.

23. A light source comprising the phosphor as claimed in claim 1, in which the primary emission of the light source serves to excite the phosphor and a maximum of the primary emission is in the range from 250 to 550 nm, and in which the primary radiation is at least partially converted into secondary radiation, in particular in order to generate white light.

24. The light source as claimed in claim 23, characterized in that the light source is an LED or OLED or discharge lamp.

* * * * *